(12) United States Patent
Copeland

(10) Patent No.: US 9,172,409 B2
(45) Date of Patent: Oct. 27, 2015

(54) MULTI-PATH DIGITAL PRE-DISTORTION

(71) Applicant: Xilinx, Inc., San Jose, CA (US)

(72) Inventor: Gregory C. Copeland, Savannah, TX (US)

(73) Assignee: XILINX, INC., San Jose, CA (US)

(*) Notice: Subject to any disclaimer, the term of this patent is extended or adjusted under 35 U.S.C. 154(b) by 78 days.

(21) Appl. No.: 14/088,252

(22) Filed: Nov. 22, 2013

(65) Prior Publication Data

US 2015/0146822 A1    May 28, 2015

(51) Int. Cl.
| | | |
|---|---|---|
| *H04B 1/04* | (2006.01) | |
| *H03F 1/32* | (2006.01) | |
| *H03F 3/24* | (2006.01) | |
| *H03F 3/189* | (2006.01) | |
| *H04L 27/36* | (2006.01) | |

(52) U.S. Cl.
CPC ............ *H04B 1/0475* (2013.01); *H03F 1/3241* (2013.01); *H03F 1/3258* (2013.01); *H03F 3/189* (2013.01); *H03F 3/245* (2013.01); *H04B 1/04* (2013.01); *H04B 1/0483* (2013.01); *H04L 27/367* (2013.01); *H03F 2200/111* (2013.01); *H03F 2201/3209* (2013.01); *H03F 2201/3212* (2013.01); *H03F 2201/3224* (2013.01); *H03F 2201/3233* (2013.01); *H04B 2001/0425* (2013.01)

(58) Field of Classification Search
CPC ....... H03F 1/32; H03F 1/3241; H03F 1/3252; H03F 3/189; H03F 3/245; H04B 1/0475; H04B 1/0483; H04B 17/001; H04B 2001/0408; H04B 2001/0425; H04B 1/04; H04B 1/475; H04L 27/367; H04L 27/368

USPC .......... 375/254, 284, 285, 296, 297; 330/149; 381/94.1, 94.3, 94.4; 455/114.2, 114.3
See application file for complete search history.

(56) References Cited

U.S. PATENT DOCUMENTS

| | | | |
|---|---|---|---|
| 6,973,141 B1 | 12/2005 | Isaksen et al. | |
| 8,306,149 B2 * | 11/2012 | Mujica et al. | 375/296 |
| 8,982,995 B1 * | 3/2015 | Van Cai | 375/297 |
| 2009/0252255 A1 * | 10/2009 | Lee et al. | 375/297 |

(Continued)

OTHER PUBLICATIONS

Bassam, S., et al., "2-D Digital Predistortion (2-D-DPD) Architecture for Concurrent Dual-Band Transmitters" IEEE Transactions on Microware Theory and Techniques, vol. 59, No. 10, Oct. 2011, 2011 IEEE, pp. 2547-2553.

(Continued)

*Primary Examiner* — Young T Tse
(74) *Attorney, Agent, or Firm* — W. Eric Webostad

(57) ABSTRACT

An apparatus relates generally to multi-path digital predistortion. In this apparatus, a single-band digital predistorter engine has first and second sample paths. An input stage is coupled to receive input samples and configured to separate them into first samples and second samples. The input stage provides first and second magnitudes for the first and second samples, respectively. A first set of digital predistorters receives the first samples, the first magnitudes and the second magnitudes. A second set of digital predistorters receives the second samples, the second magnitudes and the first magnitudes. An output stage is coupled to receive predistorted outputs from the first set of digital predistorters and the second set of digital predistorters and is configured to provide a digital predistorted composite signal from the first set of digital predistorters and the second set of digital predistorters.

20 Claims, 7 Drawing Sheets

(56) References Cited

U.S. PATENT DOCUMENTS

| | | | |
|---|---|---|---|
| 2010/0316157 A1 | 12/2010 | Bassam et al. | |
| 2012/0069931 A1 | 3/2012 | Gandhi et al. | |
| 2013/0100991 A1* | 4/2013 | Woo | 375/219 |
| 2014/0347126 A1* | 11/2014 | Laporte et al. | 330/149 |

OTHER PUBLICATIONS

Ding, L., et al., "Concurrent Dual-Band Digital Predistortion", Texas Instruments, 2012 IEEE MTT-S International, Jun. 17-22, 2012, pp. 1-5, Montreal, QC, CA.

Roblin, P., et al., "Frequency-Selective Predistortion Linearization of RF Power Amplifiers", IEEE Transactions on Microwave Theory and Techniques, vol. 56, No. 1, Jan. 2008, 2007 IEEE, pp. 65-76.

Vaananen, O., et al.; "Reducing the Peak to Average Ratio of Multicarrier GSM and Edge Signals", Electronic Circuit Design Laboratory, Helsinki University of Technology, IEEE PIMRC 2002, Sep. 15-18, 2002, pp. 1-5, Lisbon, Portugal.

Kim, et al., "A New Architecture for Frequency-Selective Digital Predistortion Linearization for RF Power Amplifiers", Microwave Symposium Digest (MTT), 2012 IEEE MTT-S International, Jun. 17-22, 2012, Montreal, QC, Canada, pp. 1-3, IEEE.

* cited by examiner

US 9,172,409 B2

MULTI-PATH DIGITAL PRE-DISTORTION

FIELD OF THE INVENTION

The following description relates to integrated circuit devices ("ICs"). More particularly, the following description relates to multi-path digital pre-distortion ("DPD") for an IC.

BACKGROUND

Digital predistortion is used to enhance linearity of output of a power amplifier, conventionally for transmission of a wireless signal from a base station. Multiband or Multi-Radio Access Technology ("Multi-RAT") conventionally involves a same power amplifier capable of supporting transmission for at least two bands with a single carry type in each band. These bands may be widely separated from one another as compared with bandwidth of each of such operating bands.

Hence, it is desirable and useful to provide improved digital predistortion for input to a power amplifier for transmission of a signal.

SUMMARY

An apparatus relates generally to multi-path digital predistortion. In such an apparatus, a single-band digital predistorter engine has a first sample path and a second sample path. An input stage of the digital predistorter engine is coupled to receive input samples and is configured to separate the input samples into first samples and second samples. The input stage is further configured to provide first magnitudes for the first samples and second magnitudes for the second samples. A first set of digital predistorters of the digital predistorter engine is coupled to receive the first samples, first magnitudes and the second magnitudes. A second set of digital predistorters of the digital predistorter engine is coupled to receive the second samples, the second magnitudes and the first magnitudes. An output stage of the digital predistorter engine is coupled to receive predistorted outputs from the first set of digital predistorters and the second set of digital predistorters and is configured to provide a digital predistorted composite signal of the predistorted outputs from the first set of digital predistorters and the second set of digital predistorters.

Another apparatus relates generally to multi-band digital predistortion. In such an apparatus, a multiband digital predistorter engine has a first band path and a second band path. An input stage of the digital predistorter engine is coupled to receive first input samples via the first band path and second input samples via the second band path. The input stage is configured to provide first interpolated samples for the first input samples and second interpolated samples for the second input samples. The input stage is further configured to provide first interpolated magnitudes for the first interpolated samples and second interpolated magnitudes for the second interpolated samples. A first pair of digital predistorters of the digital predistorter engine is coupled to receive the first interpolated samples, the first interpolated magnitudes and the second interpolated magnitudes. A second pair of digital predistorters of the digital predistorter engine is coupled to receive the second interpolated samples, the second interpolated magnitudes and the first interpolated magnitudes. An output stage is coupled to receive predistorted outputs from the first pair of digital predistorters and the second pair of digital predistorters and is configured to provide a digital predistorted composite signal of the predistorted outputs from the first pair of digital predistorters and the second pair of digital predistorters.

Yet another apparatus relates generally to multi-band digital predistortion. In such an apparatus, a digital predistorter engine has a single band path. An input stage of the digital predistorter engine is coupled to receive input samples via the band path. The input stage is configured to provide first magnitudes and second magnitudes for the input samples. The input samples are for a two-dimensional nonlinear function. The first magnitudes and the second magnitudes each are linear transformations for a one-dimensional nonlinear function. A pair of digital predistorters of the digital predistorter engine is coupled to receive the input samples, the first magnitudes, and the second magnitudes. An output stage of the digital predistorter engine is coupled to receive predistorted outputs from the pair of digital predistorters and is configured to provide a digital predistorted composite signal of the predistorted outputs from the pair of digital predistorters.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
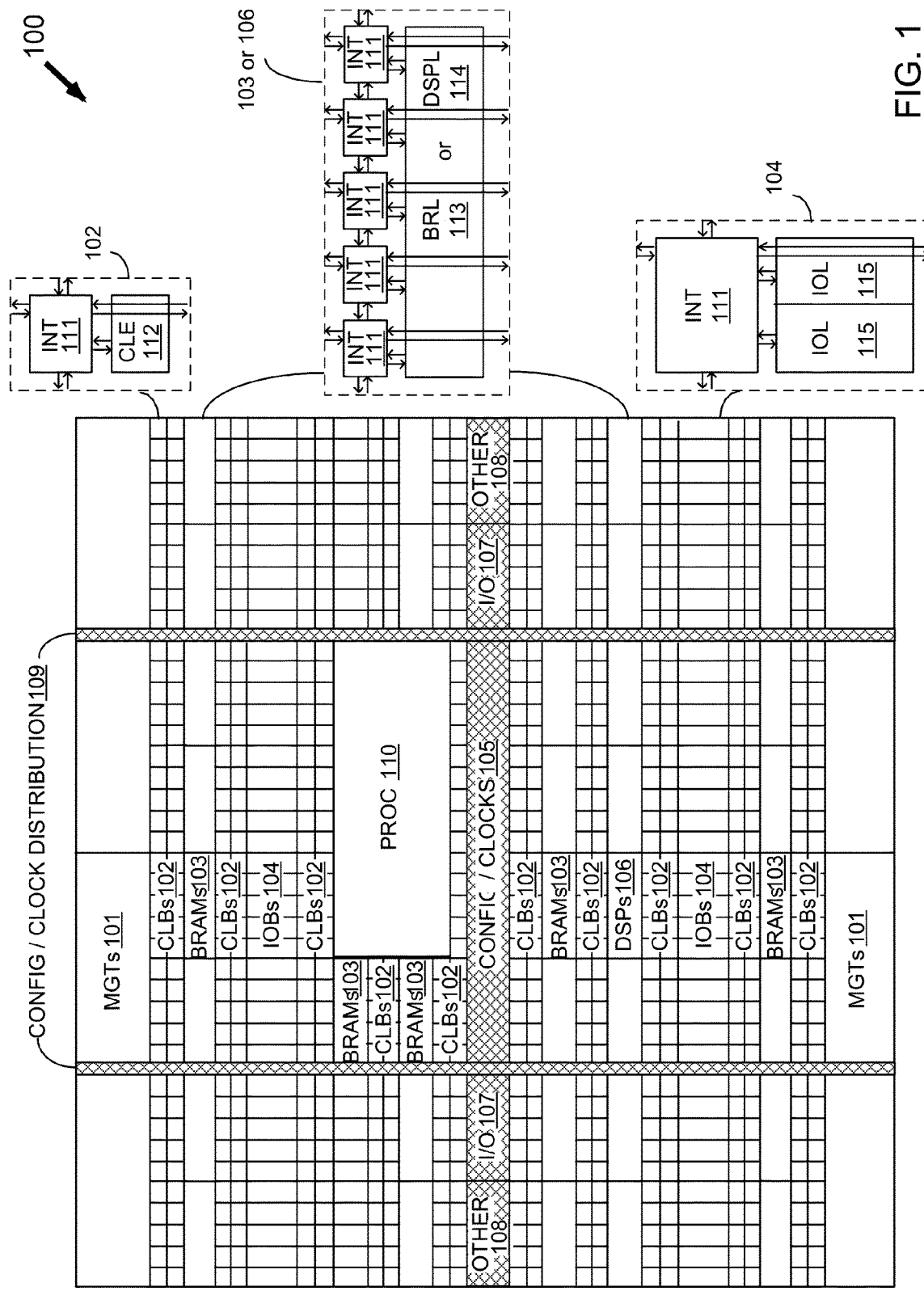
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent; however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Having spaced-apart carrier stacks occupying a small portion of end-to-end bandwidth leads to high sampling rates and high complexity. As described below in additional detail, modular digital predistortion ("DPD") is provided by parsing input samples into multiple sample paths and/or having each band separately processed with cross-coupling between samples of such separately processed bands.

With the above general understanding borne in mind, various configurations for digital predistorter engines are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

For linearization of outputs of power amplifiers, such as for multiband or multi Radio Access Technology ("Multi-RAT") at least two bands with a single carrier type in each band may be present. For purposes of clarity by way of example and not limitation, numerical examples are provided; however, these or other values may be used.

Figure 2:
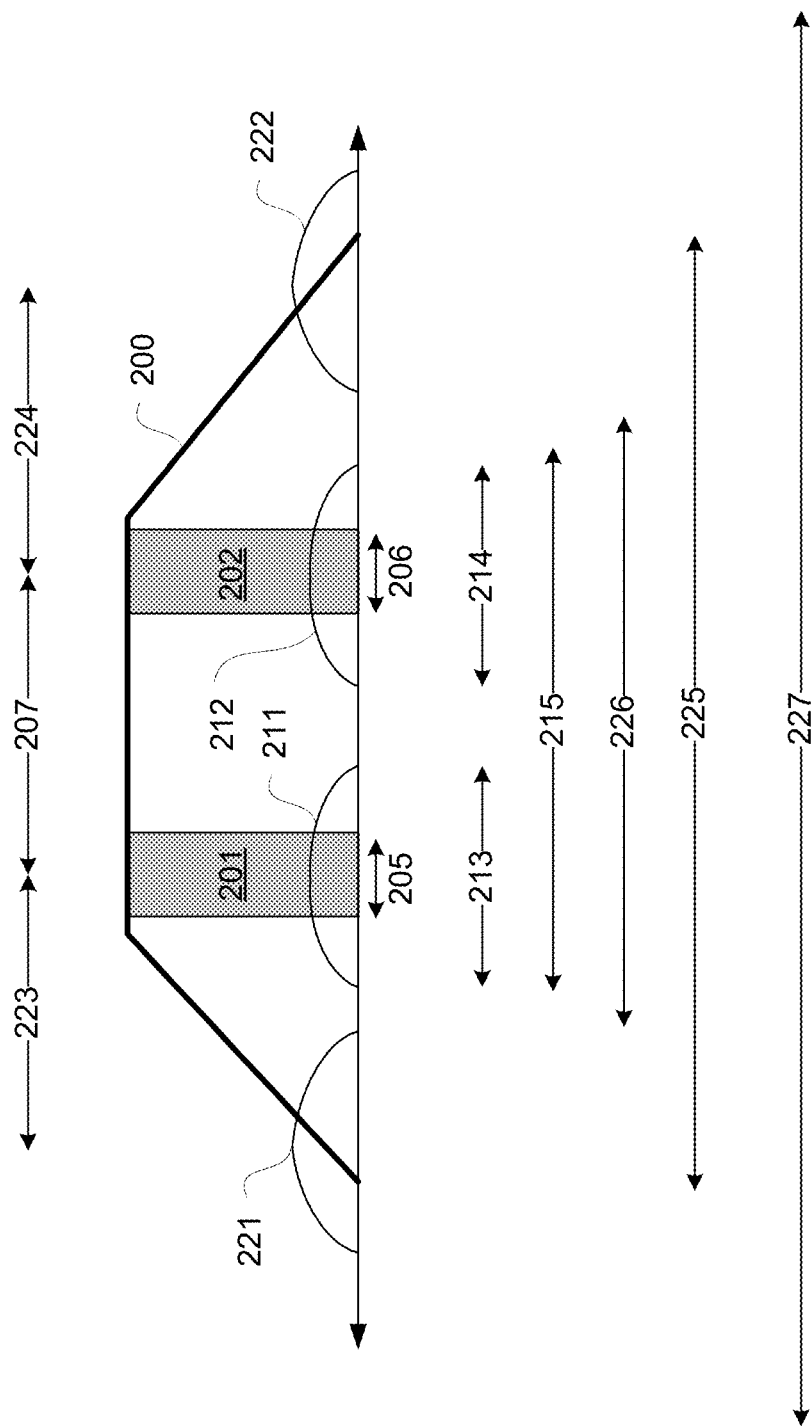
FIG. 2 is a graphical diagram depicting an exemplary conventional cavity filter response.

FIG. 2 is a graphical diagram depicting an exemplary conventional cavity filter response 200. Cavity filter response 200 is for a sampling rate that encompasses two carrier operating bands, as generally indicated as carrier stack 201 and carrier stack 202. In this example, each operating band 205 and 206 respectively of carrier stacks 201 and 202 is 20 MHz. These non-overlapping operating bands 205 and 206 are separated by a guard bandwidth or guard band 207. In this example, guard band 207 from center-to-center of carrier stack 201-to-carrier stack 202 is 120 MHz, which is substantially larger than the bandwidth of each of operating bands 205 and 206.

In-band intermodulation distortion ("IMD") 211 associated with carrier stack 201 is non-overlapping with in-band IMD 212 associated with carrier stack 202, and both IMD 211 and 212 are encompassed by cavity filter response 200, namely these are both encapsulated forms of in-band distortion. In this example, bandwidths 213 and 214 respectively for IMD 211 and IMD 212 are each 60 MHz. To span both IMD 211 and IMD 212 a DPD bandwidth 215 heretofore may have been 160 MHz.

Out-of-band ("OOB") IMD 221 associated with carrier stack 201 may exist inside, as well as outside, cavity filter response 200. In this example, bandwidth 223 from a center of carrier stack 201 to at least a center of OOB IMD 221 is 120 MHz. Likewise, OOB IMD 222 associated with carrier stack 202 may exist outside as well as inside cavity filter response 200. In this example, bandwidth 224 from a center of carrier stack 202 to at least a center of OOB IMD 224 is 120 MHz.

In this example, bandwidth 226 is 250 MHz FB observation without aliasing, and bandwidth 225 of cavity filter response 200 is 300 MHz for this cavity stop band assuming a 2:1 shape factor. An FF Nyquist bandwidth 227 for a digital-to-analog converter ("DAC") for this example is 500 MHz. Accordingly, it should be appreciated that for two bands or carries separated in frequency by a sufficient amount such that their in-band IMD 211 and 212 do not overlap means that a high sample rate is used to provide a cavity filter response 200 enveloping both bands as well as both in-band IMD terms. Some systems may employ a single power amplifier and a single digital predistorter to cover such a large range, and so providing such components to cover such a large frequency range with such a high sampling rate adds a substantial amount of cost.

By only allowing terms that are in band, this implies that IMD terms that affect wider band behavior cannot be corrected. Here in-band IMD 211 and 212 near each band may be corrected, but wider band or OOB ("out of band") IMD 221 and 222 may not be corrected. If each band is separated by 120 MHz for example, then IMD terms at 120 MHz on either side of such two bands cannot be corrected.

As described below in additional detail, by processing a signal by band, total bandwidth processed may be at least reduced, and may be minimized. Moreover, by processing individual carriers where occupied bandwidth ("BW") therefor is small compared to a total bandwidth, a more economical result may be obtained by processing each individual band. For example, in some multi-carrier GSM ("MC-GSM") systems, for example where a carrier BW is approximately 200 KHz and two or more carriers are spaced 1 MHz or more from each other on a regular channelization scheme, a significant savings may be obtained by processing each band separately, as described below in additional detail. MC-GSM is just one example, and other communication protocols may be used. However, continuing the MC-GSM example, there may be six carriers in 30 MHz of bandwidth, where occupied bandwidth is 6*200 KHz=1.2 MHz. This may be only 4% of the total bandwidth for such MC-GSM example. Assuming that processing is proportional to processed bandwidth, then a substantial savings, for this example possibly approximately 25 times, may be obtained by performing digital pre-distortion ("DPD") operations on a per carrier basis.

Figure 3:
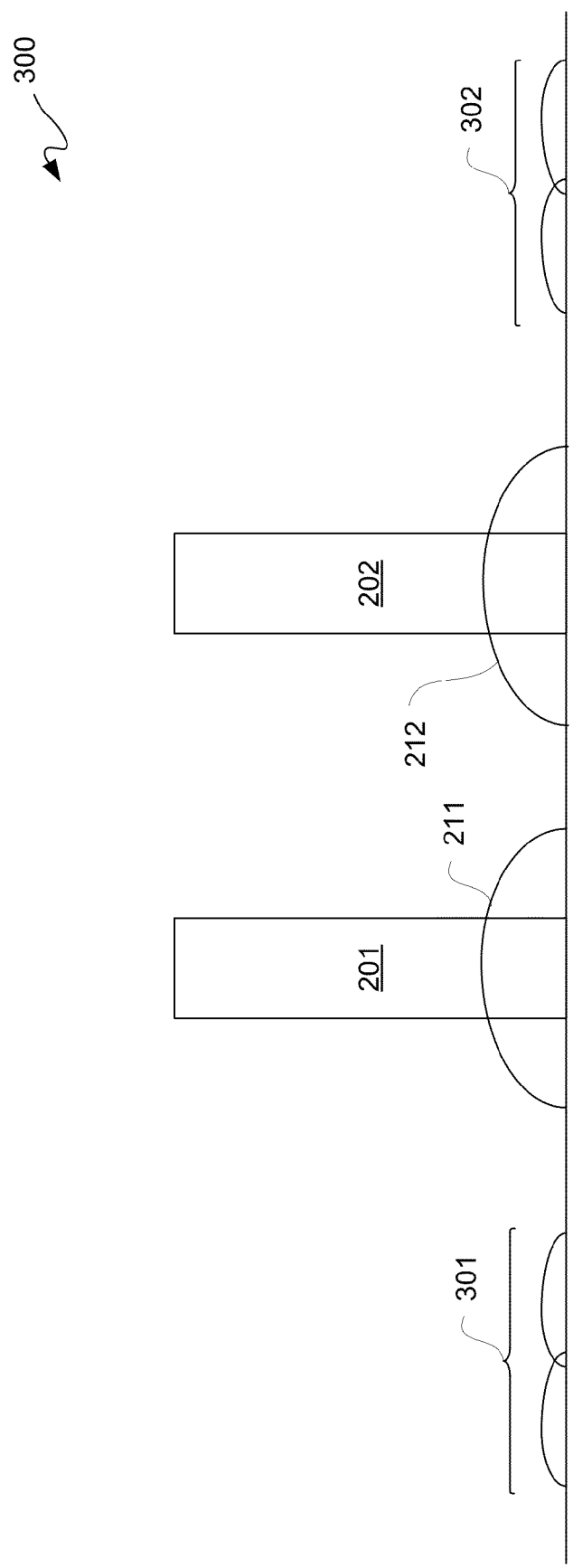
FIG. 3 is a graphical diagram depicting an exemplary linear system without the cavity filter response of FIG. 2.

Along those lines, FIG. 3 is a graphical diagram depicting an exemplary linear system 300 without a cavity filter response 200 of FIG. 2. Linear system 300 may be assumed to have the same example frequencies as used in the example of FIG. 2 for purposes of clarity.

Carrier stacks 201 and 202, as well as IMD 211 and 212, are present as before in FIG. 2; however, in linear systems, each band may be processed individually, so performing the processing on a band or carrier basis may be used. Processing each band separately allows for a lower sample rate to be used than in the example of FIG. 2.

In nonlinear processing, bands/carriers outputs are dependent on other bands and carriers. As described below in additional detail, processing is described below which reduces costs while maintaining performance over nonlinear processing. Moreover, by allowing DPD behavior to be different in each carrier/band, performance may be improved in a linear system over that of a conventional nonlinear processing.

Because OOB IMD may be far removed from each band 201 and 202, such OOB IMD may be eliminated or at least substantially reduces by aliasing and filtering for example, namely aliased and filtered IMD 301 and 302 respectively corresponding to what was OOB IMD 221 and 222. Such OOB IMD may be eliminated using a cavity filter or similar filter, as such OOB IMD is far enough away from bands of interest. Therefore, only in-band terms may be generated by a DPD, further reducing processing complexity and cost.

Generation of such in-band terms is described below. Additionally, adaption of coefficients associated with a composite digital pre-distorted signal is described below, where such adaption significantly reduces complexity of an adaptation process compared to that of implementation of a conventional DPD system.

Even though each of the following predistorter engines described may be implemented in an FPGA, such description is not limited to implementation in an FPGA. Along those lines, each of the following predistorter engines may be implemented in any IC, including without limitation another type of SoC, an ASIC, an ASSP, or the like, whether a monolithic IC or an SiP.

Figure 4A:
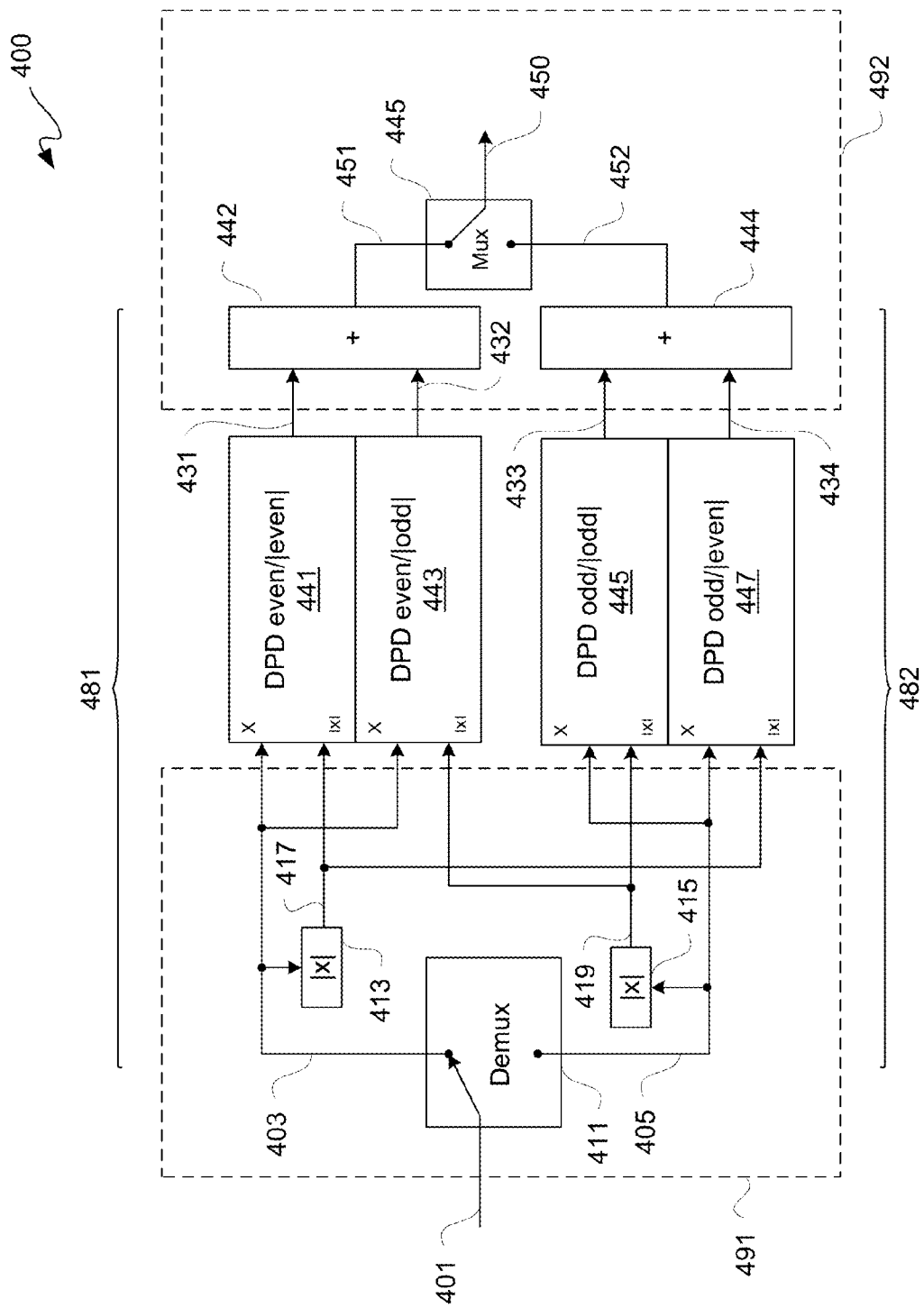
FIGS. 4A and 4B are a block diagram depicting an exemplary digital predistorter engine.
Figure 4B:
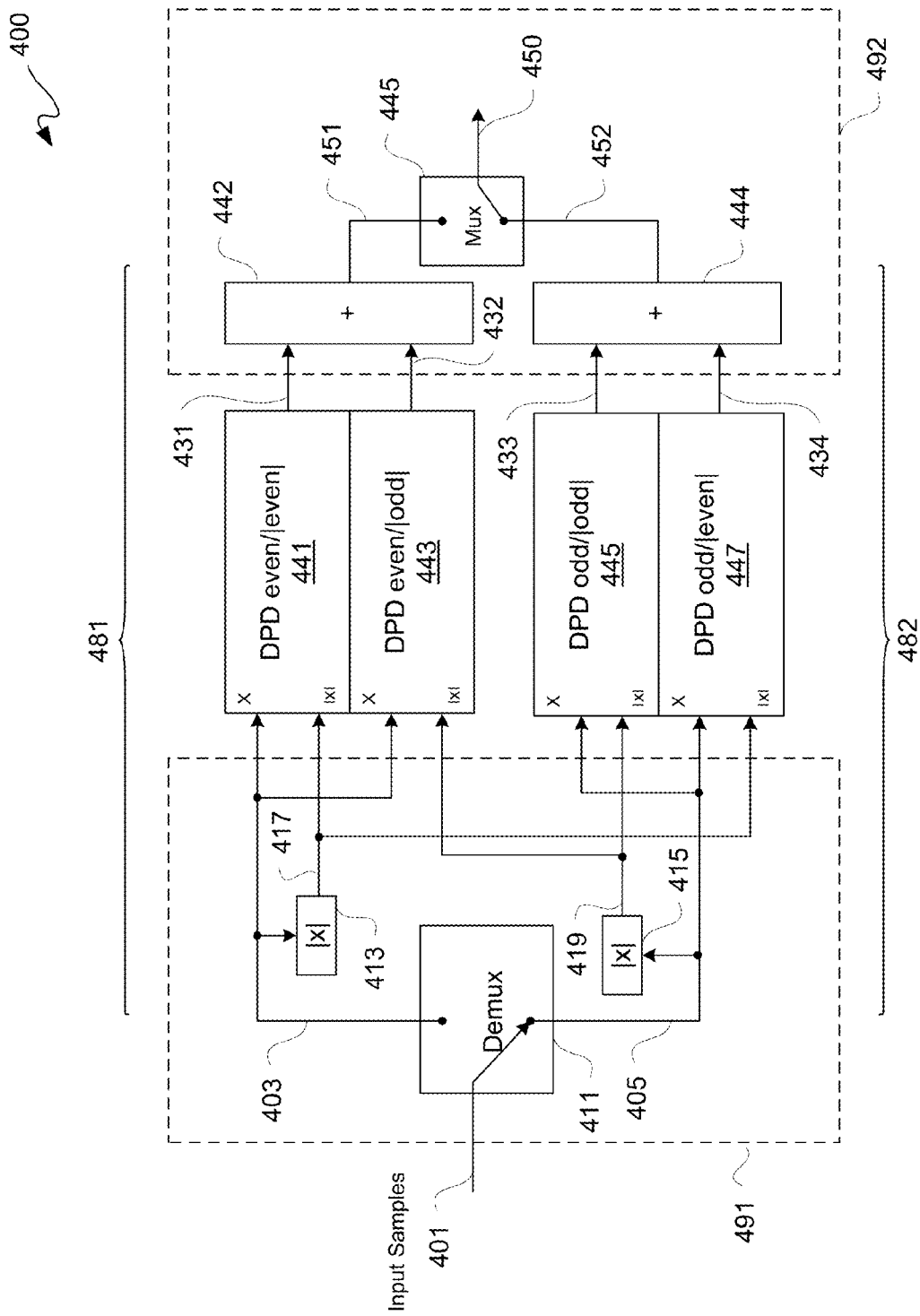

FIGS. 4A and 4B are a block diagram depicting an exemplary digital predistorter engine 400 in different switching states. Digital predistorter engine 400 is further described with simultaneous reference to FIGS. 4A and 4B. FIGS. 4A and 4B each show different switching states as shown, for example, by Demux 411 and Mux 445.

A multicarrier or multiband crest factor reduction ("CFR") may be provided to at least reduce, if not minimize, peak signal amplitude prior to the predistortion processing. With respect to predistorter engine 400, a sample rate may be decreased by a factor of two or more compared to a more direct predistortion implementation. However, from the description of predistorter engine 400, it will be appreciated that higher sample rate reductions may be obtained by processing by a factor of 3 or more depending on the signal spectrum. For example, an input sample stream may be broken out into thirds, fourths, etc., as will be understood from the description of breaking an input sample stream out into two, namely even and odd samples.

Digital predistorter engine 400 in FIG. 4A is a single-band digital predistorter engine having an first sample path 481 and a second sample path 482, which in this example are an even sample path and an odd sample path, respectively. Predistorter engine 400 may include a demultiplexer 411, magnitude blocks 413 and 415, DPDs 441, 443, 445 and 447, adders or combiners 442 and 444, and a multiplexer 445. More generally, magnitude blocks 413 and 415 can be any monotonic function of an input magnitude.

An input stage 491 of digital predistorter engine 400 may be coupled to receive input samples 401 and configured to separate input samples 401 into even samples 403 and odd samples 405. Input stage 491 may further be configured to provide even magnitudes 417 for even samples 403 and odd magnitudes 419 for odd samples 405.

A first set of digital predistorters 441 and 443, which in this example is a first pair, of digital predistorter engine 400 may be coupled to receive even samples 403 and to respectively receive even magnitudes 417 and odd magnitudes 419. A second set of digital predistorters 445 and 447, which in this example is a second pair, of digital predistorter engine 400 may be coupled to receive odd samples 405 and to respectively receive odd magnitudes 419 and even magnitudes 417. For more than two sample paths, more digital predistorters may be used for each sample path. For Similar to digital predistorters 441, 443, 445, 447 for example, for three sample paths, three sets of three digital predistorters each may be used of three blocks each. Along those lines, generally, digital predistorter engine 400 may be linearly scaled to accommodate larger numbers of sample paths. Furthermore, each digital predistorter may be conventional.

An output stage 492 of digital predistorter engine 400 may be coupled to receive predistorted outputs, such as predistorted outputs 431, 432, 433 and 434 for example, from such first pair of digital predistorters and such second pair of digital predistorters and may be configured to provide a digital predistorted composite signal 450 of such predistorted outputs 431, 432, 433 and 434 from such first pair of digital predistorters and such second pair of digital predistorters.

Input stage 491 includes demultiplexer 411 coupled to receive input samples 401 to toggle switching of outputs to provide even samples 403 and odd samples 405 therefrom. A magnitude block 413 of input stage 491 may be coupled to receive even samples 403 to provide even magnitudes 417 of even samples 403. A magnitude block 415 of input stage 491 may be coupled to receive odd samples 405 to provide odd magnitudes 419 of odd samples 405.

Digital predistorter 441 and digital predistorter 433 may each be coupled to receive even samples 403. Digital predistorter 444 and digital predistorter 447 may be coupled to receive odd samples 405. Digital predistorter 441 and digital predistorter 447 may be coupled to receive even sample magnitudes 417. Digital predistorter 443 and digital predistorter 445 may be coupled to receive odd sample magnitudes 419. Accordingly, magnitudes of even and odd samples are cross-coupled as between even sample path 481 and an odd sample path 482.

Digital predistorter 441 may be coupled to provide a predistorted output 431 for even samples 403 and even sample magnitudes 417 input thereto. Digital predistorter 443 may be coupled to provide a predistorted output 432 for even samples 403 and odd sample magnitudes 417 input thereto. Digital predistorter 445 may be coupled to provide a predistorted output 433 for odd samples 405 and odd sample magnitudes 419 input thereto. Lastly, digital predistorter 447 may be coupled to provide a predistorted output 434 for odd samples 405 and even sample magnitudes 417 input thereto.

Output stage 492 may include adders 442 and 444, as well as a multiplexer 445. Adder 442 may be coupled to add or combine predistorted output 431 and predistorted output 432 to provide digital predistorted samples 451. Adder 444 may be coupled to add or combine predistorted output 433 and predistorted output 434 to provide digital predistorted samples 452. Multiplexer 445 may be coupled to receive digital predistorted samples 451 and digital predistorted samples 452 and configured to alternately select samples as between digital predistorted samples 451 and digital predistorted samples 452 for output from multiplexer 445 to provide digital predistorted output samples for digital predistorted composite signal 450. For example, a sample clock signal (not shown for purposes of clarity) for a sample rate may be used as a control select signal for both demultiplexer 411 and multiplexer 445.

DPD processing, such as by digital predistorters 441, 443, 445, and 447 for example, for multi-path single band DPD may generally be mathematically described as:

$$y(n) = \sum_i x(n-i) \sum_j \sum_k a_{i,j,k} F_j(|x(n-k)|)$$

for output samples y(n), input samples x(n), a(i, j, k) coefficients, and a one-dimensional nonlinear function $F_j$. Such equation may be expanded as follows:

$$y(2n) = \sum_i x(2n-2i) \sum_j \sum_k a_{i,j,k} F_j(|x(2n-k)|) +$$
$$\sum_i x(2n-2i) \sum_j \sum_k a_{i,j,k} F_j(|x(2n-k-1)|)$$

and $$y(2n+1) = \sum_i x(2n+1-2i) \sum_j \sum_k a_{i,j,k} F_j(|x(2n-k)|) +$$
$$\sum_i x(2n+1-2i) \sum_j \sum_k a_{i,j,k} F_j(|x(2n-k-1)|)$$

In these equations, y(2n) corresponds to signal 451, and y(2n+1) corresponds to signal 452. From these equations, it may be seen that DPD may be factored into multiple DPD blocks or sets of digital predistorters for multiple paths, including without limitation even and odd samples. Digital predistorters, such as predistorters 441, 443, 445, and 447, may be responsible for determining or computing respective terms in such equations, namely even/|even| terms, even/|odd| terms, odd/|odd| terms, and odd/|even| terms, which are respectively determined by predistorters 441, 443, 445, and 447. Moreover, not all terms in such equations need be determined for each implementation, namely an entire array of such terms need not be fully populated. Depending on the specifics of term selection, one or more of array entries may be eliminated. As an example, in a memory polynomial only the diagonal is populated so only even/|even| and odd/|odd| array entries may be used to reduce determination or computation by a factor of two. Other forms of masks may be used to reduce computational effort.

Figure 5:
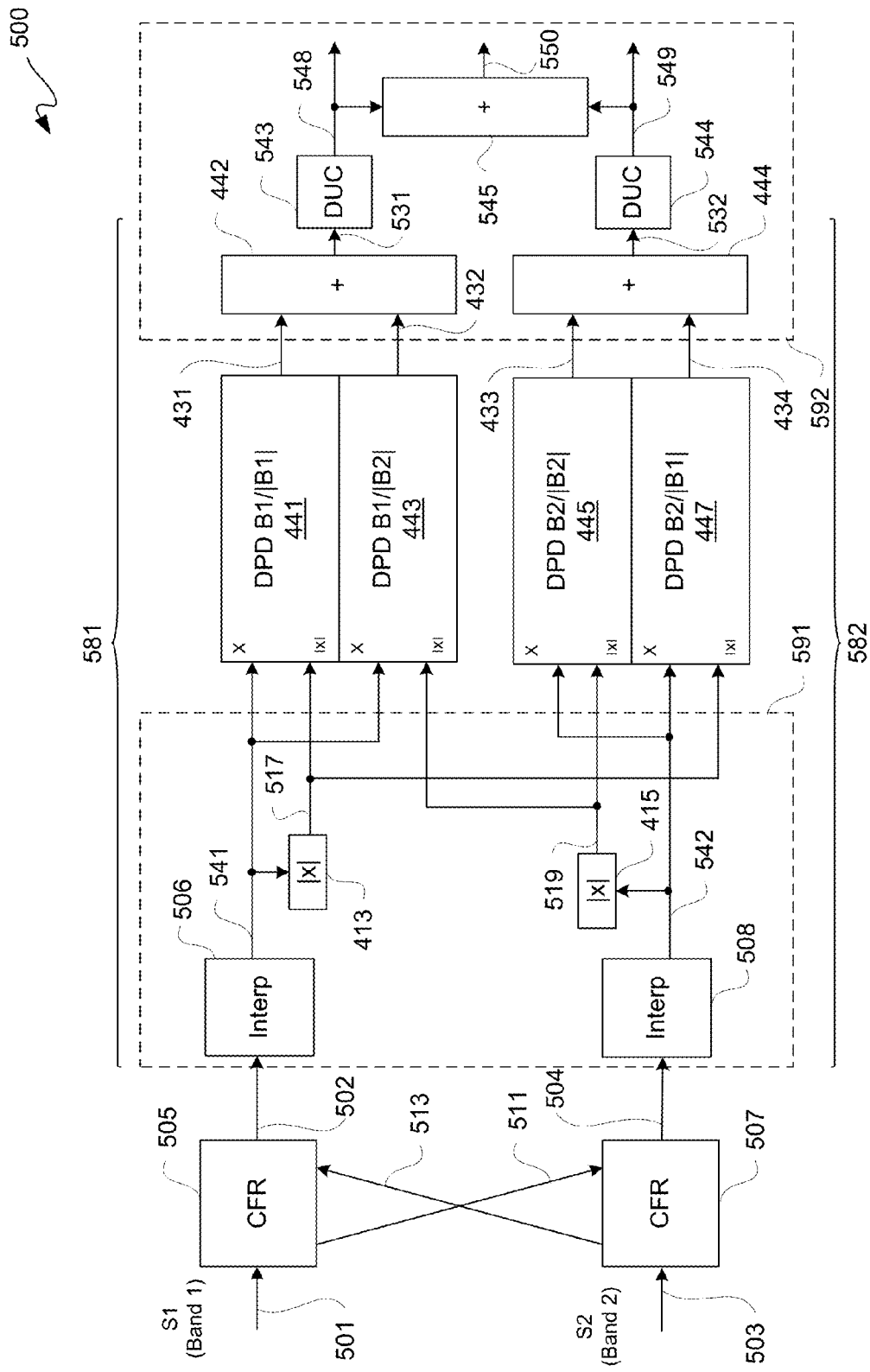
FIG. 5 is a block diagram depicting another exemplary digital predistorter engine.

FIG. 5 is a block diagram depicting an exemplary digital predistorter engine 500. An upper portion or half of digital predistorter engine 500 may be used as a single channel DPD block; however, a lower portion or half of digital predistorter engine 500 may be coupled to such upper portion for a multiband application. Along those lines, multiple instances of digital predistorter engine 500 may be coupled to one another to handle various numbers of channels and/or bands to provide a multicarrier or multiband crest factor reduction ("CFR") system, such as to reduce sample rates.

Digital predistorter engine 500 has a band path 581 and a band path 582. An input stage 591 of digital predistorter engine 500 may be coupled to receive input samples 502 via band path 581 and input samples 504 via band path 582. Band paths 581 and 582 are for two different spaced apart bands.

Input stage 591 may be configured to provide interpolated samples 541 for input samples 502 and interpolated samples 542 for input samples 504. Input stage 591 may further be configured to provide interpolated magnitudes 517 for interpolated samples 541 and interpolated magnitudes 519 for interpolated samples 542.

A first set of digital predistorters, which in this example is a first pair of digital predistorters 441 and 443, of digital predistorter engine 500 may be coupled to receive interpolated samples 541 and to respectively receive interpolated magnitudes 517 and interpolated magnitudes 519. A second set of digital predistorters, which in this example is a second pair of digital predistorters 445 and 447, of digital predistorter engine 500 may be coupled to receive interpolated samples 542 and to respectively receive interpolated magnitudes 519 and interpolated magnitudes 517.

An output stage 592 may be coupled to receive predistorted outputs, such as for example predistorted outputs 431, 432, 433, and 434 respectively from digital predistorters 441, 443, 445, and 447, and output stage 592 may be configured to provide a digital predistorted composite signal 550 of such predistorted outputs. Digital predistorted composite signal 550 may be coupled to a DAC (not shown) for converting such digital output to an analog input to a power amplifier (not shown).

Input stage 591 may include interpolators 506 and 508, as well as magnitude blocks 413 and 415 or other function of the input magnitudes. Interpolator 506 may be coupled to receive input samples 502 to provide interpolated samples 541. Interpolator 508 may be coupled to receive input samples 504 to provide interpolated samples 542. Interpolators 506 and 508 may be respective linear interpolators. Magnitude block 413 may be coupled to receive interpolated samples 541 to provide interpolated magnitudes 517. Magnitude block 415 may be coupled to receive interpolated samples 542 to provide interpolated magnitudes 519.

Digital predistorter 441 and digital predistorter 443 may be coupled to receive interpolated samples 541. Digital predistorter 445 and digital predistorter 447 may be coupled to receive interpolated samples 542. Digital predistorter 441 may be coupled to receive interpolated magnitudes 517. Digital predistorter 443 may be coupled to receive interpolated magnitudes 519. Digital predistorter 445 may be coupled to receive interpolated magnitudes 519. Digital predistorter 447 may be coupled to receive interpolated magnitudes 517.

Digital predistorter 441 may be coupled to provide a predistorted output 431 for interpolated samples 541 and interpolated magnitudes 517 input thereto. Digital predistorter 443 may be coupled to provide a predistorted output 432 for interpolated samples 541 and interpolated magnitudes 519 input thereto. Digital predistorter 445 may be coupled to provide a predistorted output 433 for interpolated samples 542 and interpolated magnitudes 519 input thereto. Digital predistorter 447 may be coupled to provide a predistorted output 434 for interpolated samples 542 and interpolated magnitudes 517 input thereto. Thus, digital predistorter 441 may determine band 1 ("B1") and B1 magnitude terms; digital predistorter 443 may determine B1 and band 2 ("B2") magnitude terms; digital predistorter 445 may determine B2 and B2 magnitude terms; and digital predistorter 447 may determine B2 and B1 magnitude terms.

Output stage 592 may include adders or combiners 442, 444 and 545, as well as digital up-converters ("DUCs") 543 and 544. Adder 442 may be coupled to add predistorted output 431 and predistorted output 432 to provide digital predistorted samples 531. Adder 444 may be coupled to add predistorted output 433 and predistorted output 434 to provide digital predistorted samples 532. Digital up-converter 543 may be coupled to receive digital predistorted samples 531 to provide digital up-converted samples 548. Digital up-converter 444 may be coupled to receive digital predistorted samples 532 to provide digital up-converted samples 549. Adder 545 may be coupled to combine digital up-converted samples 548 and 549 to provide a digital predistorted composite signal 550, which may be provided as an input to a DAC for conversion to an analog signal for input to a power amplifier. Likewise, digital up-converted samples 548 and 549 may respectively be provided as two separate two-band outputs to respective DACs for providing respective analog signals for each band and combined in the analog domain and then applied to the power amplifier.

Digital predistorter engine 500 may be coupled to or include crest factor reduction ("CFR") blocks 505 and 507. CFR block 505 may be coupled to receive B1 samples 501 associated with a carrier stack, such as carrier stack 201, to provide input samples 502, namely to provide crest factor reduced input samples to reduce demands on a downstream power amplifier of a transmission chain. Likewise, CFR block 507 may be coupled to receive B2 samples 503 associated with another carrier stack, such as carrier stack 202, to provide input samples 504, namely to provide crest factor reduced input samples to reduce demands on a downstream power amplifier of a transmission chain. Again, such carrier stacks may be spaced apart in frequency from one another. Moreover, for such multiband processing, CFR block 505 may be coupled to provide a magnitude signal 511 from B1 samples 501 to CFR block 507, and, likewise, CFR block 507 may be coupled to provide a magnitude signal 513 from B2 samples 503 to CFR block 505. Thus, CFR blocks 505 and 507 may be cross-coupled for multiband CFR further reducing computational effort.

Suppose, for example, that a transmission chain is capable of operating at 100 mega samples per second ("Msps"), and suppose occupied bandwidth is 20 MHz wide and with in-band IMD such band effectively is 30 MHz wide. If there is a bandwidth allocation of 60 MHz, then two sample streams, each for a 30 MHz wide application, may be independently processed for digital predistortion with two separate instances of digital predistortion engine 400 to expand the bandwidth to 60 MHz. However, if two 60 MHz wide bands were to be employed, then an instance of digital predistortion engine 500 may be used with four nested instances of digital predistortion engine 400.

It should be appreciated that multiple instances of digital predistorter engine 400 may be used to expand a bandwidth without increasing sample rate, and digital predistorter engine 500 may be used to accommodate two or more bands in a modular format. However, another multiband DPD, as described below in additional detail, may be used in some systems for any of a variety of reasons. For example, a reduction in digital and RF path bandwidths may be a factor, where simultaneous bandwidth and dynamic range adjustments are not available with a conventional DPD implementation. Another example may be where each band is small compared to total bandwidth of a system, and so process rate and complexity may be reduced by uses of multiband DPD. Yet another example may be where different bands with distinct or non-overlapping IMD terms, namely where all of such terms from each band are orthogonal to one another, then adaption complexity may be significantly reduced, including a reduction in sample rate used. Still yet another example may be where each band may be individually or separately optimized, leading to a higher overall performance as different power amplifier characteristics in each band may be optimized independently.

In the above equation used to provide a general series of terms used in a linearized DPD as described herein, a function F may have polynomial terms (e.g., $F_j(x)=x^j$ or orthogonal polynomial terms). Moreover, such function F may be selected to have splines or some other function. In the above example, function F was a magnitude, namely $F_j(|x(n-k)|)$. However, another input may be $|x|^2$ or other monotonic mapping function. Such squaring for example may be used to reduce or minimize bandwidth to reduce sample rate used to support a multiband application with less hardware. Coefficients for such equations may be disposed in an array, where: a horizontal axis of such array is indexed by index i; a vertical axis of such array is indexed by index k, and some values in such array or matrix may be mask values for masking instances of index k. For example, a polynomial mask may be a binary string, which may be in decimal format.

To determine y(n) for two inputs $x_1(n)$ and $x_2(n)$ for $x(n)=x_1(n)+x_2(n)$, namely representing the signal in each band, a magnitude squared function may be used. Thus, the above equation for such a function may be written as:

$$y(n) = \sum_i x(n-i) \sum_j \sum_k a_{i,j,k} F_j(|x(n-k)|^2) =$$

$$y_1(n) + y_2(n) = \sum_i x_1(n-i) + x_2(n-i)$$

$$\sum_j \sum_k a_{i,j,k} F_j(x_1(n-k) + x_2(n-k), x_1(n-k)* + x_2(n-k)*) =$$

$$\sum_i x_1(n-i) + x_2(n-i)$$

$$\sum_j \sum_k a_{i,j,k} F_j(x_1(n-k) + x_2(n-k) x_1(n-k) + x_2(n-k)*)$$

By separating such two bands and allowing different nonlinear ("NL") responses in each band, the above equation may be written as two separate equations as follows:

$$y_1(n) = \sum_i x_1(n-i) \sum_j \sum_k a_{i,j,k}^1 F_j\left(\begin{array}{c} x_1(n-k)+x_2(n-k), \\ x_1(n-k)*+x_2(n-k)* \end{array}\right)$$

$$y_2(n) = \sum_i x_2(n-i) \sum_j \sum_k a_{i,j,k}^2 F_j\left(\begin{array}{c} x_1(n-k)+x_2(n-k), \\ x_1(n-k)*+x_2(n-k)* \end{array}\right)$$

In the equations herein, a superscript * is used to indicate conjugation. Functions F may be two-dimensional memoryless functions for a nonlinear channel. The above two equations may be decomposed into four one-dimensional equations to accurately approximate such two-dimensional equations reducing complexity. Such one-dimensional equations are as follows:

$$y_1(n) = \sum_i x_1(n-i) \sum_j \sum_k a_{i,j,k}^1 |x_1(n-k)|^j |x_2(n-k)|^j$$

$$y_1(n) = \sum_i x_1(n-i) \sum_j \sum_k G_{i,j,k}(Ai[|x_1(n-k)|, |x_2(n-k)|])$$

$$y_2(n) = \sum_i x_2(n-i) \sum_j \sum_k a_{i,j,k}^2 |x_1(n-k)|^j |x_2(n-k)|^j$$

$$y_2(n) = \sum_i x_2(n-i) \sum_j \sum_k G_{i,j,k}(Ai[|x_1(n-k)|, |x_2(n-k)|])$$

where $G_j^2$ represents a one-dimensional nonlinear function. The matrices Aj may be of 1×2 dimension which transform the 2 or more input magnitudes to a single linear combination of the inputs for use by function G. With a sufficient number of nonlinear functions, a desired multidimensional nonlinear function can be approximated with a sufficient level of accuracy using the one dimensional functions G.

From the above equations, a one-dimensional nonlinear function may be used for each DPD block. Conventionally, each DPD block may be implemented with a 2-dimentional look-up table ("LUT"). However, as dimensionality increases, the number of terms used to represent N dimensional NL functions likewise increases, and so a more complex and/or memory intensive LUT is used. However, as described below in additional detail, rather than having for example the combination of two-dimensional linear functions followed by one dimensional nonlinear functions may be used to approximate the multidimensional nonlinear functions $F_i$ from above, a linear transformation may be used in order to have a DPD with one-dimensional nonlinear functions, which reduces complexity and resource usage.

Figure 6:
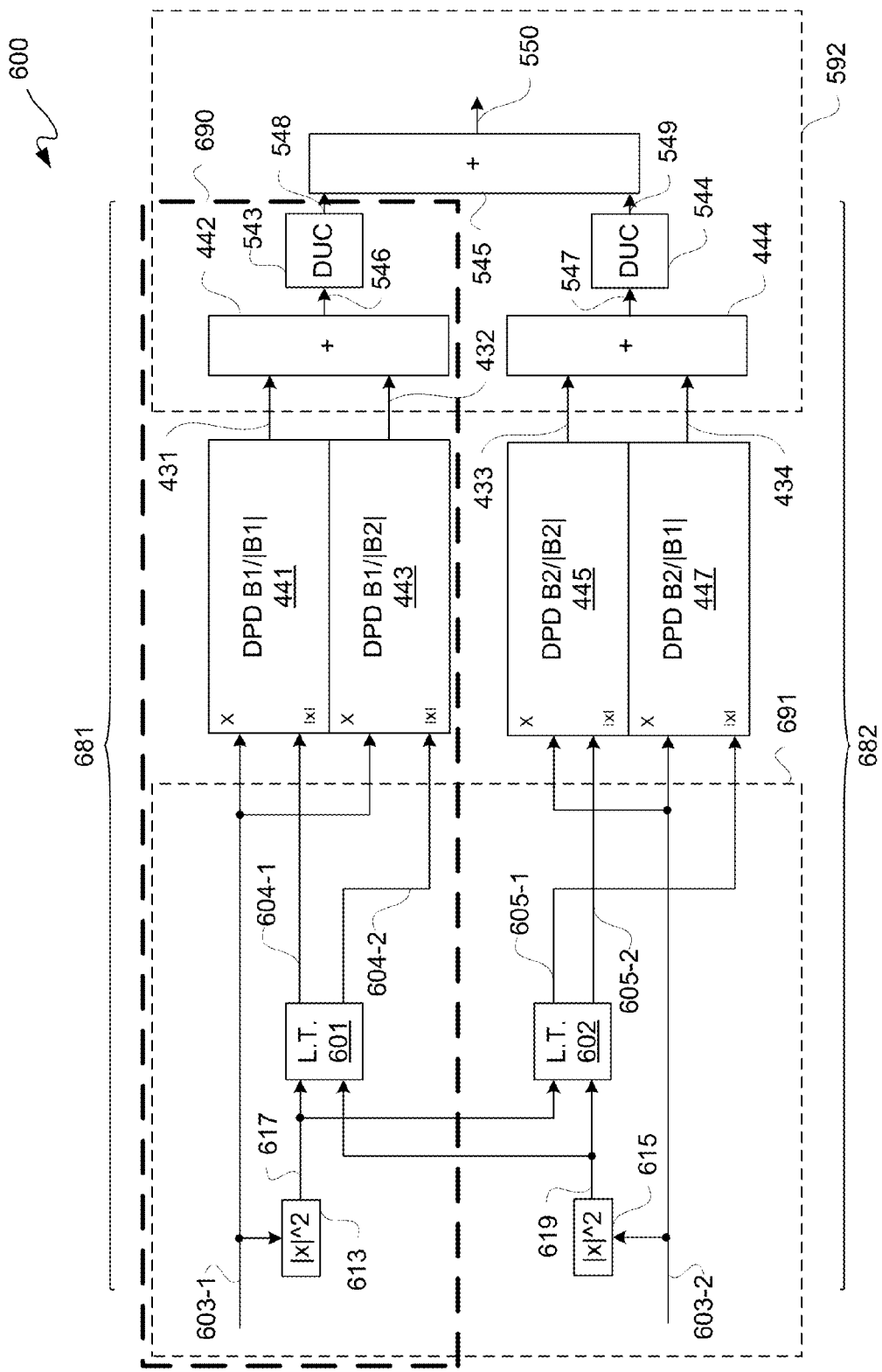
FIG. 6 is a block diagram depicting yet another exemplary digital predistorter engine.

FIG. 6 is a block diagram depicting an exemplary multiband digital predistorter engine 600. Digital predistorter engine 600 may employ just an upper half or portion 690 without a final adder 550 for a single band application. In such an implementation, there would not be a cross-coupling with another portion or half, as same may not be present. However, in order to appreciate a multiband implementation, digital predistorter engine 600 is described as having a band path 681 and a band path 682 for two separate bands.

An input stage of digital predistorter engine 600 may be coupled to receive input samples 603-1 for a band path 681 and input samples 603-2 for a separate band path 682. Though separate, band paths 681 and 682 are cross-coupled as described below in additional detail.

Input stage 691 of digital predistorter engine 600 may be configured to provide transformed magnitudes 604-1 for the input samples 603-1, transformed magnitudes 605-2 for input samples 603-2, cross-coupled transformed magnitudes 605-1 for input samples 603-1, and cross-coupled transformed magnitudes 604-2 for input samples 603-2.

A first set of digital predistorters, which in this example is a first pair of digital predistorters 441 and 443, of digital predistorter engine 600 may be coupled to receive input samples 603-1 for a first band and to respectively receive transformed magnitudes 604-1 and cross-coupled transformed magnitudes 604-2. Where transformed magnitudes 604-1 are one-dimensional linear transformations of a nonlinear function for sample magnitudes 617, cross-coupled transformed magnitudes 604-2 are one-dimension linear transformations of such a nonlinear function for sample magnitudes 619.

A second set of digital predistorters, which in this example is a second pair of digital predistorters 445 and 447, of digital predistorter engine 600 may be coupled to receive input samples 603-2 and to respectively receive transformed magnitudes 605-2 and cross-coupled transformed magnitudes 605-1.

An output stage 592 of digital predistorter engine 600 may generally be the same as previously described, though with some different signals due to differences between input stage 591 of FIG. 5 and input stage 691. Accordingly, description of output stage 592 is not repeated here.

Input stage 691 of digital predistorter engine 600 includes magnitude blocks 613 and 615, as well as linear transformation blocks ("L.T.") 601 and 602. Magnitude blocks 613 and 615 may be respective magnitude squared blocks.

Magnitude block 613 may be coupled to receive input samples 603-1 to provide sample magnitudes 617 outputs therefrom. Magnitude block 615 may be coupled to receive input samples 603-2 to provide sample magnitudes 619 output therefrom. Linear transformation block 601 may be coupled to receive sample magnitudes 617 and sample magnitudes 619 to provide transformed magnitudes 604-1 and cross-coupled transformed magnitudes 604-2, respectively. Linear transformation block 602 may be coupled to receive sample magnitudes 619 and sample magnitudes 617 to provide the transformed magnitudes 605-2 and cross-coupled transformed magnitudes 605-1.

Digital predistorter 441 and digital predistorter 443 may be coupled to receive input samples 603-1 of a first band. Digital predistorter 445 and digital predistorter 447 may be coupled to receive input samples 603-2. Digital predistorter 441 may be coupled to receive transformed magnitudes 604-1, and digital predistorter 443 may be coupled to receive cross-coupled transformed magnitudes 604-2. Digital predistorter 445 may be coupled to receive transformed magnitudes 605-2, and digital predistorter 447 may be coupled to receive cross-coupled transformed magnitudes 605-1.

Digital predistorter 441 may be coupled to provide a predistorted output 431 for input samples 603-1 and transformed magnitudes 604-1 therefor. Digital predistorter 443 may be coupled to provide a predistorted output 432 for input samples 603-1 and cross-coupled transformed magnitudes 604-2. Digital predistorter 445 may be coupled to provide a predistorted output 433 for input samples 603-2 and transformed magnitudes 605-2. Digital predistorter 447 may be coupled to provide a predistorted output 434 for input samples 603-2 and cross-coupled transformed magnitudes 605-1.

Digital predistorter engine 400 of FIGS. 4A and 4B, digital predistorter engine 500 of FIG. 5, and/or multiband digital predistorter engine 600 of FIG. 6 may be implemented using one or more ICs, including without limitation one or more ASICs, ASSPs, and/or FPGAs. For example, for an FPGA implementation, engines 400, 500, or 600 may be implemented using DSP blocks or slices 106 of FPGA 100 of FIG. 1.

With the above description borne in mind, expansion of available DPD bandwidth may be performed in a modular way, as described above. Digital predistorter engines as described herein may be used as building block(s) to be organized into wider bandwidth and higher performance DPD solutions. Higher performance DPD may be provided with such modular digital predistorter engines, as each band can be optimized separately to accommodate variations of power amplifier behavior in different frequency bands. Band locations and sizes may be tailored for optimizing performance matched to power amplifier, signal, and performance parameters. Furthermore, complexity is reduced for occupied bandwidth with such modular digital predistorter engines, where such occupied bandwidth is substantially narrower than a total end to end bandwidth. Such modular digital predistorter engines may provide greater flexibility in the terms of selection of a DPD output bandwidth efficiently matched to a transmission RF path bandwidth. Such tailored DPD may be used to eliminate aliasing, as aliasing may decrease performance of DPD, and such modular DPD may be provided without increasing computational effort as compared with conventional DPD. Additionally, such modular digital predistorter engines allow DPD topologies to be abstracted to provide a specific topology which may be more efficient by some objective metrics.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
    a single-band digital predistorter engine having a first sample path and a second sample path;
    an input stage of the digital predistorter engine configured to receive input samples and configured to separate the input samples into first samples and second samples;
    the input stage further configured to provide first magnitudes for the first samples and second magnitudes for the second samples;
    a first set of digital predistorters of the digital predistorter engine configured to receive the first samples, the first magnitudes and the second magnitudes;
    a second set of digital predistorters of the digital predistorter engine configured to receive the second samples, the second magnitudes and the first magnitudes; and
    an output stage of the digital predistorter engine configured to receive predistorted outputs from the first set of digital predistorters and the second set of digital predistorters and configured to provide a digital predistorted composite signal of the predistorted outputs from the first set of digital predistorters and the second set of digital predistorters.

2. The apparatus according to claim 1, wherein:
    the first sample path is an even sample path;
    the second sample path is an odd sample path;
    the first set of digital predistorters is a first pair of digital predistorters; and
    the second set of digital predistorters is a second pair of digital predistorters.

3. The apparatus according to claim 2, wherein the input stage comprises:
    a demultiplexer configured to receive the input samples to provide even samples and odd samples therefrom;
    a first magnitude block configured to receive the even samples to provide even magnitudes of the even samples; and
    a second magnitude block configured to receive the odd samples to provide odd magnitudes of the odd samples.

4. The apparatus according to claim 3, wherein:
    a first digital predistorter and a second digital predistorter of the first pair of digital predistorters are configured to receive the even samples;
    a third digital predistorter and a fourth digital predistorter of the second pair of digital predistorters are configured to receive the odd samples;

the first digital predistorter and the fourth digital predistorter are configured to receive the even magnitudes;
the second digital predistorter and the third digital predistorter are configured to receive the odd magnitudes;
the first digital predistorter is configured to provide a first predistorted output for the even samples and the even magnitudes;
the second digital predistorter is configured to provide a second predistorted output for the even samples and the odd magnitudes;
the third digital predistorter is configured to provide a third predistorted output for the odd samples and the odd magnitudes;
the fourth digital predistorter is configured to provide a fourth predistorted output for the odd samples and the even magnitudes; and
the predistorted outputs include the first predistorted output, the second predistorted output, the third predistorted output, and the fourth predistorted output.

5. The apparatus according to claim 4, wherein the output stage comprises:
a first adder configured to add the first predistorted output and the second predistorted output to provide first digital predistorted samples;
a second adder configured to add the third predistorted output and the fourth predistorted output to provide second digital predistorted samples; and
a multiplexer configured to receive the first digital predistorted samples and the second digital predistorted samples to alternately select between the first digital predistorted samples and the second digital predistorted samples for output from the multiplexer to provide digital predistorted output samples for the digital predistorted composite signal.

6. An apparatus, comprising:
a multiband digital predistorter engine having a first band path and a second band path;
an input stage of the digital predistorter engine configured to receive first input samples via the first band path and second input samples via the second band path;
the input stage further configured to provide first interpolated samples for the first input samples and second interpolated samples for the second input samples;
the input stage further configured to provide first interpolated magnitudes for the first interpolated samples and second interpolated magnitudes for the second interpolated samples;
a first pair of digital predistorters of the digital predistorter engine configured to receive the first interpolated samples, the first interpolated magnitudes and the second interpolated magnitudes;
a second pair of digital predistorters of the digital predistorter engine configured to receive the second interpolated samples, the second interpolated magnitudes and the first interpolated magnitudes; and
an output stage configured to receive predistorted outputs from the first pair of digital predistorters and the second pair of digital predistorters and configured to provide a digital predistorted composite signal of the predistorted outputs from the first pair of digital predistorters and the second pair of digital predistorters.

7. The apparatus according to claim 6, wherein the input stage comprises:
a first interpolator configured to receive the first input samples to provide the first interpolated samples;
a second interpolator configured to receive the second input samples to provide the second interpolated samples;
a first magnitude block configured to receive the first interpolated samples to provide the first interpolated magnitudes; and
a second magnitude block configured to receive the second interpolated samples to provide the second interpolated magnitudes.

8. The apparatus according to claim 7, wherein:
a first digital predistorter and a second digital predistorter of the first pair of digital predistorters are configured to receive the first interpolated samples;
a third digital predistorter and a fourth digital predistorter of the second pair of digital predistorters are configured to receive the second interpolated samples;
the first digital predistorter is configured to receive the first interpolated magnitudes;
the second digital predistorter is configured to receive the second interpolated magnitudes;
the third digital predistorter is configured to receive the second interpolated magnitudes; and
the fourth digital predistorter is configured to receive the first interpolated magnitudes.

9. The apparatus according to claim 8, wherein:
the first digital predistorter is further configured to provide a first predistorted output for the first interpolated samples and the first interpolated magnitudes;
the second digital predistorter is further configured to provide a second predistorted output for the first interpolated samples and the second interpolated magnitudes;
the third digital predistorter is further configured to provide a third predistorted output for the second interpolated samples and the second interpolated magnitudes;
the fourth digital predistorter is further configured to provide a fourth predistorted output for the second interpolated samples and the first interpolated magnitudes; and
the predistorted outputs include the first predistorted output, the second predistorted output, the third predistorted output, and the fourth predistorted output.

10. The apparatus according to claim 9, wherein the output stage comprises:
a first adder configured to add the first predistorted output and the second predistorted output to provide first digital predistorted samples; and
a second adder configured to add the third predistorted output and the fourth predistorted output to provide second digital predistorted samples.

11. The apparatus according to claim 10, wherein the output stage further comprises:
a first digital up-converter configured to receive the first digital predistorted samples to provide first up-converted samples;
a second digital up-converter configured to receive the second digital predistorted samples to provide second up-converted samples; and
a third adder configured to combine the first up-converted samples and the second up-converted samples to provide the digital predistorted composite signal.

12. The apparatus according to claim 6, further comprising:
a first crest factor reduction block configured to receive a first carrier stack to provide the first input samples; and
a second crest factor reduction block configured to receive a second carrier stack to provide the second input samples, wherein the first carrier stack is spaced apart in frequency from the second carrier stack,
the first crest factor reduction block is configured to provide a first magnitude signal to the second crest factor reduction block, and
the second crest factor reduction block is configured to provide a second magnitude signal to the first crest factor reduction block.

13. An apparatus, comprising:
an a digital predistorter engine having a single band path;
input stage of the digital predistorter engine configured to receive input samples via the band path;
the input stage further configured to provide first magnitudes and second magnitudes for the input samples;
the input samples being for a two-dimensional nonlinear function;
the first magnitudes and the second magnitudes each being linear transformations for a one-dimensional nonlinear function;
a pair of digital predistorters of the digital predistorter engine configured to receive the input samples, the first magnitudes, and the second magnitudes; and
an output stage of the digital predistorter engine configured to receive predistorted outputs from the pair of digital predistorters and configured to provide a digital predistorted composite signal of the predistorted outputs from the pair of digital predistorters.

14. The apparatus according to claim 13, wherein:
the band path is a first band path;
the digital predistorter engine includes the first band path and a second band path for a first band separate from a second band, respectively;
the input samples are first input samples;
the input stage of the digital predistorter engine is further configured to receive the first input samples via the first band path and second input samples via the second band path;
the first magnitudes are first linear transformed magnitudes;
the input stage is further configured to provide the first linear transformed magnitudes for the first input samples and second linear transformed magnitudes for the second input samples;
the second magnitudes are first cross-coupled linear transformed magnitudes;
the input stage is further configured to provide the first cross-coupled linear transformed magnitudes for the second input samples and to provide second cross-coupled linear transformed magnitudes for the first input samples;
the pair of digital predistorters is a first pair of digital predistorters;
the first pair of digital predistorters of the digital predistorter engine is configured to receive the first input samples and respectively configured to receive the first linear transformed magnitudes and the first cross-coupled linear transformed magnitudes;
a second pair of digital predistorters of the digital predistorter engine is configured to receive the second input samples and respectively configured to receive the second linear transformed magnitudes and the second cross-coupled linear transformed magnitudes;
the predistorted outputs are first predistorted outputs;
the output stage is further configured to receive the first predistorted outputs from the first pair of digital predistorters and second predistorted outputs from the second pair of digital predistorters; and
the output stage is further configured to provide the digital predistorted composite signal of the first predistorted outputs and the second predistorted outputs respectively from the first pair of digital predistorters and the second pair of digital predistorters.

15. The apparatus according to claim 14, wherein the input stage comprises:
a first magnitude block configured to receive the first input samples to provide the first magnitudes;
a second magnitude block configured to receive the second input samples to provide the second magnitudes;
a first linear transformation block configured to receive the first magnitudes and the second magnitudes to provide the first linear transformed magnitudes and the first cross-coupled linear transformed magnitudes; and
a second linear transformation block configured to receive the first magnitudes and the second magnitudes to provide the second linear transformed magnitudes and the second cross-coupled linear transformed magnitudes.

16. The apparatus according to claim 15, wherein the first magnitude block and the second magnitude block are respective magnitude squared blocks.

17. The apparatus according to claim 15, wherein:
a first digital predistorter and a second digital predistorter of the first pair of digital predistorters are configured to receive the first input samples;
a third digital predistorter and a fourth digital predistorter of the second pair of digital predistorters are configured to receive the second input samples;
the first digital predistorter is further configured to receive the first linear transformed magnitudes;
the second digital predistorter is further configured to receive the first cross-coupled linear transformed magnitudes;
the third digital predistorter is further configured to receive the second linear transformed magnitudes; and
the fourth digital predistorter is further configured to receive the second cross-coupled linear transformed magnitudes.

18. The apparatus according to claim 17, wherein:
the first digital predistorter is further configured to provide a first predistorted output for the first input samples and the first linear transformed magnitudes;
the second digital predistorter is further configured to provide a second predistorted output for the first input samples and the first cross-coupled linear transformed magnitudes;
the third digital predistorter is further configured to provide a third predistorted output for the second input samples and the second linear transformed magnitudes;
the fourth digital predistorter is further configured to provide a fourth predistorted output for the second input samples and the second cross-coupled linear transformed magnitudes;
the first predistorted outputs include the first predistorted output and the second predistorted output; and
the second predistorted outputs include the third predistorted output and the fourth predistorted output.

19. The apparatus according to claim 18, wherein the output stage comprises:
a first adder configured to add the first predistorted output and the second predistorted output to provide first digital predistorted samples;
a second adder configured to add the third predistorted output and the fourth predistorted output to provide second digital predistorted samples;

a first digital up-converter configured to receive the first digital predistorted samples to provide first up-converted samples; and a second digital up-converter configured to receive the second digital predistorted samples to provide second up-converted samples.

20. The apparatus according to claim 19, wherein the output stage further comprises a third adder configured to combine the first up-converted samples and the second up-converted samples to provide the digital predistorted composite signal.

* * * * *